United States Patent [19]

Takami

[11] Patent Number: 4,619,871

[45] Date of Patent: Oct. 28, 1986

[54] COPPER FOIL FOR PRINTED CIRCUIT BOARD

[75] Inventor: Masato Takami, Kyoto, Japan

[73] Assignee: Fukuda Metal Foil & Powder Co., Ltd., Japan

[21] Appl. No.: 671,985

[22] Filed: Nov. 15, 1984

[30] Foreign Application Priority Data

Jun. 28, 1984 [JP] Japan .................. 59-134923

[51] Int. Cl.$^4$ .................................. B32B 15/08
[52] U.S. Cl. .................. 428/607; 428/612; 428/626; 428/675; 174/68.5
[58] Field of Search ............ 428/607, 675, 674, 687, 428/626, 612; 174/68.5

[56] References Cited

U.S. PATENT DOCUMENTS

| | | | |
|---|---|---|---|
| 3,220,897 | 11/1965 | Conley | 428/606 |
| 4,190,474 | 2/1980 | Berdan et al. | 174/68.5 |
| 4,262,060 | 4/1981 | Shikata et al. | 428/675 |
| 4,376,154 | 3/1983 | Nakatsugawa | 428/607 |
| 4,468,293 | 8/1984 | Polan et al. | 428/675 |
| 4,483,906 | 11/1984 | Nakatsugawa | 428/607 |
| 4,503,112 | 3/1985 | Konicek | 428/607 |

FOREIGN PATENT DOCUMENTS

| | | | |
|---|---|---|---|
| 20347 | 2/1982 | Japan | 428/607 |
| 1211494 | 11/1970 | United Kingdom | . |
| 1349696 | 4/1974 | United Kingdom | . |

OTHER PUBLICATIONS

"Copper Foils and Electric Laminates", Chem. Abstracts 101:172572h, Jun. 1984.
"Electrodeposition of Tungsten and Molybdenum with Iron-Group Metals", Zak et al., Chem. Abstracts 92:171466k, 1979.
"Corrosion Testing of a Cobalt-Molybdenum Alloy", Karavaev et al., Chem. Abstracts 93:56707y and 93:56708z, 1977.

*Primary Examiner*—L. Dewayne Rutledge
*Assistant Examiner*—John J. Zimmerman
*Attorney, Agent, or Firm*—Lowe, Price, LeBlanc, Becker & Shur

[57] ABSTRACT

A copper foil resistant to acids and heat and yet easy to etch is obtained by forming a cobalt layer containing molybdenum and/or tungsten on the bonding surface thereof. Roughening of the foil surface prior to formation of the layer provides highly peel-resistant bonding of the foil thereat to resin-containing substrates of the type found in typical printed circuit boards. The provision of a chromate layer on the cobalt further improves the adhesion between the copper foil and resin-containing substrates.

6 Claims, No Drawings

COPPER FOIL FOR PRINTED CIRCUIT BOARD

FIELD OF THE INVENTION

This invention relates to a copper foil to be a constituent of a printed circuit board, more particularly to a copper foil of the kind appropriate for the use of intricate wiring characterized by resisting heat and chemicals.

BACKGROUND OF THE INVENTION

The miniaturization of latest electronic parts and consequent condensation of circuits composed of such cause the conducting elements of printed circuit boards to be more delicate, or to have higher density of interconnection.

Originally, printed circuit boards must have resistance to heat and chemicals, especially acids, to be durable in undergoing processes where intense heat or acids are employed, which fact becomes more significant for circuits comprising delicate conducting elements.

Reviewing the processes of producing copper conducting elements, at first a material copper foil is obtained via a rolling or electrolytic process. The electrolytic process, in which copper is electrodeposited onto a cathode from an electrolytic solution containing copper ions, is a popular method. Then the surface of the copper foil is roughened electrolytically to reinforce the adhesive strength thereof to a resin forming the substrate of a printed circuit board, and the processed surface is further coated with another metal, a copper alloy or a corrosion inhibiting agent so as to repress the interaction between the copper foil and the resin.

In this regard, Japanese Patent Publication No. 51-35711 discloses a copper foil which has a layer containing one material selected from the group consisting of zinc, indium or brass. Japanese Patent Publication No. 53-39376 discloses a copper foil which has two electrodeposited copper layers and another plating layer of a metal such as zinc, brass or nickel being inactive with respect to a resin to which the copper foil is laminated. Also, Japanese Patent Publication No. 58-500149 discloses a copper foil which has an electrodeposited zinc nodule or dendrite and a layer of a substance containing at least one selected from the group of copper, arsenic, bismuth, brass, bronze, nickel, cobalt and zinc.

However, it should be noted that when a copper foil having a layer of zinc or zinc alloy such as brass is used as the conductive element of a printed circuit board, the adhesion interface between the copper foil and the resin or its periphery is permitted to have lower resistivity to hydrochrolic acid. Precisely, since printed circuit boards must be immersed in a variety of acids or active solutions during the producing process thereof, the peel strength of the conducting elements of said conventional printed circuit boards, which easily corrode in acids, is deteriorated. Therefore, such conventional copper foils are easily peeled off the resins owing to thermal or mechanical shock when applied to the latest types of printed circuit boards, in which the width of a typical conductive element is very narrow.

Further considering other substances for the layer, nickel or tin, which are soluble in ferric chloride etching solution being popularly used, are insoluble in alkali etching solutions and have a fatal drawback of entailing stain which deteriorates the dielectric property of the printed circuit board.

Meanwhile, cobalt, which is soluble in both ferric chloride and alkali etching solutions, has lower resistivity to hydrochloric acid (not so extreme as zinc), which fact is a practical problem.

SUMMARY OF THE INVENTION

Accordingly, it is an object of this invention to provide a copper foil free from the aforesaid conventional problems.

In order to obtain a copper foil of this invention, a layer comprised of cobalt and molybdenum and/or tungsten (the "layer", hereinafter) is electrodeposited onto the surface of a copper foil disposed as a cathode from a solution containing the ions of the selected metals.

The copper foil having a layer composed of cobalt and molybdenum and/or tungsten obtained in the above way consequently has the merits of: better adhesive properties to a resin, higher resistivity to chemicals and heat, solubility in alkali etching solutions, and avoidance of detrimental stains.

The layer composed of cobalt and molybdenum and/or tungsten to be electrodeposited onto a copper foil desirably has the thickness of 0.01 $\mu$m to 1 $\mu$m. When the thickness is under 0.01 $\mu$m, the layer does not operate well enough as a barrier, and when the thickness is over 1 $\mu$m the layer affects the conductivity of the copper foil owing to the deterioration of the purity of the copper resulting in an increase in the producing cost of printed circuit boards.

The content of the molybdenum and/or tungsten in the cobalt layer desirably amounts to 5 to 40 percent by weight when calculated as molybdenum and tungsten. When the content is under 5 percent by weight, the cobalt layer has low resistivity to chemicals, contrary to the object of this invention. However, when the content is over 40 percent by weight, the cobalt layer becomes insoluble in etching solutions.

The layer of the invention can be produced by using an electroplating method, a chemical-plating method, a vacuum vaporization method or a spattering method, each of these method being well known in the field. Above all, the electroplating method is practically the best for the production of printed circuit boards. In this case, the layer can be obtained by electrolyzing the cathode consisting of a copper foil in an electrolytic solution containing ions of cobalt and molybdenum and/or tungsten. The electrolytic solution in which the metal ions are employed can be an oxi-carboxylic acid solution such as a citric acid solution or a tartaric acid solution, a pyrophosphoric acid solution, a cyanide solution, or the like. Of these, the citric acid solution can be the best in terms of causing no environmental pollution. Of course, the other solution can be used instead.

Cobalt ions to be dissolved in the citric acid solution can be obtained from cobalt sulfate, ammonium cobalt sulfate, cobalt citrate or cobalt acetate. Molybdenum ions to be dissolved in the citric acid can be obtained from molybdic acid, sodium molydbate, potassium molybdate or ammonium molybdate. It must be noted at this juncture that since molybdic acid is hard to dissolve in water, only a very small amount thereof can be annexed to the citric acid. Tungsten ions to be dissolved in the citric acid can be obtained from sodium tungstate, potassium tungstate or ammonium tungstate. Citric acid ions can be obtained from citric acid, sodium citrate, potassium citrate or ammonium citrate. The amount of the citric acid ions, which also depends on that of the other metalic ions, is preferably more than 10 to 20 g/l when calculated as citric acid. When the amount thereof is less than 10 g/l, the electrodeposit obtained therefrom tends to be undesirable. It becomes worse when the solution contains molybdenum ion. Meanwhile, since tungsten ion has a property of settling in any dilute acid solution, there must be enough citric acid dissolved in the solution to prevent the settlement of the tungsten.

When either molybdenum ion or tungsten ion is employed independently with cobalt ion, the molybdenum ion or the tungsten ion preferably amounts to 2 to 60 percent by weight (calculated as Mo or W) with respect to the whole metal ions (the cobalt ion and the molybdenum or tungsten ion). When molybdenum ion and tungsten ion are employed together with cobalt ion, the molybdenum ion and the tungsten ion preferably amounts in all to 2 to 60 percent by weight (calculated as Mo and W) with respect to the total of the metal ions (the cobalt ion, the molybdenum ion and the tungsten ion). In both these cases, when the amount of the molybdenum ion and/or tungsten ion is less than about 2 percent by weight, the resistivity of the electrodeposited layer to chemicals is deteriorated. When the amount of the molybden ion and/or tungsten ion is more than about 60 percent by weight, the layer tends to be insoluble in etching solutions. When the molybdenum ion amounts to more than about 60 percent by weight with respect to the total of the metal ions, the electrodeposit being obtained therefrom grows inefficiently and consequently provides poor adhesion to resins.

The temperature of the solution is preferably maintained at between normal temperature and 50 degree centigrade. The cathodic current density, which also depends on the amount of citric acid ions and metal ions, should be maintained at 0.5 to 15 A/dm$^2$, preferably at 1 to 8 A/dm$^2$. The pH value should be kept at 2 to 8. The efficiency of the electrodeposition is lowered when the pH value is below 2 or above 8. The anode preferably consists of an insoluble metal such as stainless steel or platinum.

When the electrodeposit is composed of cobalt and molybdenum, the color of the electrodeposit is changed from gray, brown to yellowish (reddish) brown in accordance with the increase of molybdenum ion therein. The electrodeposit is believed an alloy of cobalt and molybdenum, including molybdenum oxide and molybednum hydroxide on its surface. As stated before, the alloy containing a considerable amount of molybdenum, showing yellowish (reddish) color, has poor adhesion to resin. Consequently the electrodeposit showing a gray, blue or brown color is suitable for being used as a barrier layer.

When the electrodeposit is composed of cobalt and tungsten, the color of the electrodeposit changes only from gray to blackish gray in disregard of the increase of tungsten ion. Judging from this phenomenon, the electrodeposit is seemed to be mainly an alloy of cobalt and tungsten.

When the electrodeposit is composed of cobalt, molybdenum and tungsten, of course both molybdenum and tungsten indicate their properties, and the molybdenum influences the electrodeposit more because it tends to be electrodeposited easier than tungsten.

As is obvious from the above example of a citric acid solution, the cobalt layer containing molybdenum and/or tungsten can easily be obtained under a wide range of electrodeposition conditions, which fact means the method can readily be put to practical use industrially.

It should be noted that by immersing or electrolytically treating the copper foil in chromic acid, sodium dichromate, potassium dichromate or such, after coating the cobalt layer thereon, the anticorrosion properties as well as the adhesive properties to resins of thus-obtained copper foil can be improved.

PREFERRED EMBODIMENT OF THE INVENTION

EXAMPLE (1)

Previously roughened copper foils, each of thickness 35 $\mu$m, are disposed as cathodes in respective solutions of the compositions shown in Table I(a) and are electrolyzed under respective electrolytical conditions as shown in Table I(a) with the pH of the solutions being at 5.0 (conditioned by sulfuric acid) and the temperature being at 35° C. Then the copper foils are washed in water and immersed into an aqueous solution containing potassium dichromate, dissolved at a concentration of 10 g/l, for 20 seconds. After that, the copper foils are washed in water again and then dried. Thus processed copper foils are laminated onto glass/epoxy substrates of grade FR4 to produce copper print boards. The properties of the copper print boards of specimens A to K are found as shown in Table I(b) respectively according to several tests.

On the other hand, specimens (i) to (iv), which are made by means of conventional methods, are provided for being compared with the specimens A to K. In the specimens (i) to (iv), roughened copper foils same as those used in the specimens A to K treated under respective conditions shown in Table I(a) are, after undergoing a plating process using chromic acid or chromate solution, washed in water and then dried up. The processed copper foils are laminated onto glass/epoxy substrates of grade FR4 to produce copper print boards. The properties are found as shown in Table I(b) according to several tests.

According to these results, the peel strength (in the normal condition) of the copper print boards A to K of this invention is comparatively higher than that of copper print boards of the specimens (i) to (iv) obtained by means of the conventional methods. Furthermore, the boards of this invention deteriorate less than the boards of the conventional methods after being immersed in hydrochrolic acid. The peel strength of each of the boards of this invention becomes considerably higher than the boards of the conventional methods after being submitted to heat.

In contrast to the boards of the conventional methods which are accompanied by strains after undergoing the etching process, the boards of this invention entails no stain.

EXAMPLE (2)

Previously roughened copper foils, each of thickness 35 $\mu$m, are disposed as cathodes in respective solutions of the compositions shown in Table I(a) and are electrolyzed with the cathodic current density being at 2.0 A/dm$^2$, the pH of the solution being at 5.5 (conditioned by sulfuric acid) and the temperature being at 35° C. Then the treated copper foils are washed in water and then immersed into an aqueous solution containing potassium dichromate dessolved at a concentration of 10 g/l for 20 seconds. After that, the copper foils are washed in water again and then dried. Thus processed copper foils are laminated onto glass/epoxy substrates of grade FR4 to obtain copper print boards. At this juncture, the amount of the molybdenum and/or tungsten contained in the cobalt layer of each board is analysed. The properties of the copper print boards are found as shown in Table II(b) according to several tests.

In this case, also as observed in the specimens A to K, the peel strength (in the normal condition) of copper print boards of specimens L to S of this invention is comparatively higher than that of copper print boards of the specimens (i) to (iv) of Table I(a) and (b) obtained by means of the conventional methods. The boards of this invention deteriorate less than the boards of the conventional methods after being immersed in hydrochloric acid. The peel strength of each of the boards of this invention becomes considerably higher than the boards of the conventional method after being submitted to heat. Furthermore, the board of the specimens L to S entails no stain after undergoing the etching process.

As mentioned above, the copper print board comprising the copper foil of this invention has high resistivity to chemicals, especially hydrochloric acid, and the adhesive strength thereof to resins is not deteriorated after being subjected to heat. In addition, since the board of this invention is soluble in alkali etching solutions, let alone in ferric chloride or ammonium persulfate etching solution, the board can be widely used.

Therefore, the copper foil to be a constituent of a printed circuit board of this invention can be used as the conducting element of a circuit board of high or super-high interconnection density as well as for an ordinary printed circuit board.

TABLE I (a)

| | Composition of solutions | | | | Electrolytic conditions | |
|---|---|---|---|---|---|---|
| | $CoSO_4$ $7H_2O$ | $Na_3C_6H_5O_7$ $2H_2O$ | $Na_2M_0O_4$ $2H_2O$ | $Na_2WO_4$ $2H_2O$ | Current density ($A/dm^2$) | Time (seconds) |
| Specimens of this invention | | | | | | |
| A | 30 | 30 | 1 | 0 | 2 | 10 |
| B | 30 | 30 | 5 | 0 | 2 | 5 |
| C | 30 | 40 | 10 | 0 | 2 | 10 |
| D | 50 | 100 | 1 | 0 | 6 | 10 |
| E | 100 | 100 | 10 | 0 | 5 | 2 |
| F | 30 | 30 | 0 | 1 | 2 | 10 |
| G | 30 | 30 | 0 | 3 | 2 | 20 |
| H | 30 | 30 | 0 | 10 | 2 | 5 |
| I | 40 | 40 | 0 | 25 | 2 | 10 |
| J | 35 | 30 | 5 | 3 | 2 | 10 |
| K | 35 | 30 | 2 | 5 | 2 | 10 |
| Specimens of prior arts | | | | | | |
| i | Not processed | | | | | |
| ii | With well-known cobalt plating layer of 0.2 μm thick. | | | | | |
| iii | With well-known zinc plating layer of 0.2 μm thick. | | | | | |
| iv | With well-known nickel plating layer of 0.2 μm thick. | | | | | |

TABLE I (b)

| | Peel strength | | | Staining after etching | | |
|---|---|---|---|---|---|---|
| | Normal (g/mm) | *2Via HCl (%) | *3Via heat | *4Via alkali etching solution | *5Via ammonium persulfate solution | *6Via ferric chloride solution |
| Specimens of this invention | | | | | | |
| A | 187 | 5 | 181 | NO | NO | NO |
| B | 193 | 2 | 175 | NO | NO | NO |
| C | 197 | 1 | 170 | NO | NO | NO |
| D | 189 | 6 | 172 | NO | NO | NO |
| E | 193 | 2 | 176 | NO | NO | NO |
| F | 190 | 5 | 173 | NO | NO | NO |
| G | 184 | 4 | 169 | NO | NO | NO |
| H | 188 | 2 | 175 | NO | NO | NO |
| I | 192 | 1 | 178 | NO | NO | NO |
| J | 194 | 1 | 172 | NO | NO | NO |
| K | 189 | 3 | 179 | NO | NO | NO |
| Specimens of prior arts | | | | | | |
| i | 179 | 8 | 49 | NO | NO | NO |
| ii | 187 | 11 | 170 | NO | NO | NO |
| iii | 180 | 30 | 150 | NO | NO | NO |
| iv | 184 | 3 | 167 | YES | YES | NO |

Note:
*1Copper foil 1 mm wide is peeled off under the condition of paragraph 5.7 of JIS (Japanese Industrial Standard)-C-6481-1976.
*2Deterioration ratio (%) of the peel strength via 20% HCL, at 20° C., for 20 min.
*3Peel strength via heat of 180° C., for 48 hr.
*4Etching solution comprising NaCl and $NH_4Cl$: "Alkaetch" the trademark of Yamatoya Company at 40 to 45° C., for 6 min..
*5Containing 250 g/l of $(NH_4)_2S_2O_8$ and 25 cc/l of $H_2SO_4$ (96%) at 40 to 50° C., for 15 min..
*6Containing $FeCl_3$ of 38 percent by weight at 25° C. for 6 min..

TABLE II (a)

| | Compositions of solutions | | | | | | Weight percentage of |
|---|---|---|---|---|---|---|---|
| Specimens (2) | $CoSO_4$ $7H_2O$ | $Na_3C_6H_5O_7$ $2H_2O$ | $Na_2M_0O_4$ $2H_2O$ | $K_2M_0O_4$ $2H_2O$ | $Na_2WO_4$ $2H_2O$ | $K_2WO_4$ $2H_2O$ | $M_O$ and/or W in the barrier layer |
| L | 60 | 40 | 1 | — | — | — | 5 |
| M | 60 | 40 | — | 2 | — | — | 12 |
| N | 30 | 30 | — | 3 | — | — | 31 |
| O | 30 | 30 | 10 | — | — | — | 38 |
| P | 30 | 30 | — | — | 1 | — | 8 |
| Q | 30 | 30 | — | — | — | 3 | 10 |
| R | 30 | 30 | — | — | — | 10 | 21 |
| S | 30 | 30 | — | — | 20 | — | 23 |

TABLE II (b)

| | Properties of copper print boards | | |
|---|---|---|---|
| | Peel strength | | Staining |
| Specimens (2) | Normal (g/min) | Via HCl (%) | Via alkali |
| L | 191 | 6 | NO |
| M | 193 | 4 | NO |
| N | 188 | 2 | NO |
| O | 192 | 1 | NO |
| P | 196 | 5 | NO |
| Q | 192 | 4 | NO |
| R | 197 | 2 | NO |
| S | 190 | 2 | NO |

Note:
Peel strength test and staining test are carried out under the same condition as indicated in Table I.

I claim:

1. A copper foil, bonded to a resin-containing substrate to be a constituent of a printed circuit board, comprising:
   on that surface which is bonded to said substrate a coating cobalt layer containing at least one element selected from the group consisting of molybdenum and tungsten for improved bonding, higher resistance to chemicals and heat, and facility for etching, wherein said element is present in an amount in the range 5 to 40 percent by weight of all the metals contained in said layer.

2. A copper foil as claimed in claim 1, wherein:
   said coated surface of said copper foil is pre-roughened.

3. A copper foil as claimed in claim 1, wherein: the thickness of said layer is in the range 0.01 $\mu$m to 1.0 $\mu$m.

4. A copper foil as claimed in claim 1, further comprising:
   a chromate layer on said coated surface.

5. A copper foil as claimed in claim 2, further comprising: a chromate layer on said coated surface.

6. A copper foil, bonded to a resin-containing substrate to be constituent of a printed circuit board, comprising:
   on that surface which is bonded to said substrate a coating cobalt layer containing molybdenum and tungsten for improved bonding, higher resistance to chemicals and heat, and facility for etching, wherein said molybdenum and tungsten together are present in the range 5 to 40 percent by weight of all the metals contained in said barrier.

* * * * *